(12) United States Patent
Shibata

(10) Patent No.: US 9,997,553 B2
(45) Date of Patent: Jun. 12, 2018

(54) SEMICONDUCTOR DEVICE CONFIGURING A BACK-ILLUMINATED SOLID STATE IMAGING DEVICE AND SEMICONDUCTOR DEVICE MANUFACTURING METHOD THEREOF

(71) Applicant: LAPIS SEMICONDUCTOR CO., LTD., Kanagawa (JP)

(72) Inventor: Hiroshi Shibata, Miyagi (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days. days.

(21) Appl. No.: 15/463,116

(22) Filed: Mar. 20, 2017

(65) Prior Publication Data

US 2017/0287954 A1 Oct. 5, 2017

(30) Foreign Application Priority Data

Apr. 1, 2016 (JP) ................ 2016-074270

(51) Int. Cl.
*H01L 31/00* (2006.01)
*H01L 27/146* (2006.01)
*G02B 1/113* (2015.01)

(52) U.S. Cl.
CPC .......... *H01L 27/1462* (2013.01); *G02B 1/113* (2013.01); *H01L 27/1464* (2013.01); *H01L 27/14685* (2013.01)

(58) Field of Classification Search
CPC .. H01L 27/146–27/14893; H01L 31/00; H01L 31/18; H01L 51/42; H01L 31/0232; H01L 31/02168
See application file for complete search history.

(56) References Cited

U.S. PATENT DOCUMENTS

| 8,049,293 B2 * | 11/2011 | Iwabuchi ........ H01L 27/14601 257/228 |
| 2006/0125038 A1 * | 6/2006 | Mabuchi ........ H01L 27/14603 257/447 |
| 2010/0140675 A1 * | 6/2010 | Rhodes .......... H01L 27/14601 257/292 |

FOREIGN PATENT DOCUMENTS

JP 2005268643 A 9/2005

* cited by examiner

*Primary Examiner* — Sonya D McCall Shepard
(74) *Attorney, Agent, or Firm* — Volentine, Whitt & Francos, PLLC

(57) ABSTRACT

A semiconductor device including a light receiving portion provided in a semiconductor layer of a first conductor type, the light receiving portion being of a second conductor type that is different from the first conductor type; a buffer layer provided at a light incidence side of the light receiving portion, the buffer layer being of the first conductor type; and a low refractive index layer provided at a light incidence side of the buffer layer, the low refractive index layer having a lower refractive index than refractive indices of the semiconductor layer and the buffer layer.

9 Claims, 8 Drawing Sheets

SEMICONDUCTOR DEVICE CONFIGURING A BACK-ILLUMINATED SOLID STATE IMAGING DEVICE AND SEMICONDUCTOR DEVICE MANUFACTURING METHOD THEREOF

CROSS-REFERENCE TO RELATED APPLICATION

This application claims priority under 35 USC 119 from Japanese Patent Application No. 2016-074270, filed on Apr. 1, 2016, the disclosure of which is incorporated by reference herein.

BACKGROUND

Technical Field

The present disclosure relates to a semiconductor device and a semiconductor device manufacturing method.

Related Art

Front-illuminated (FSI: frontside illumination) and back-illuminated (BSI: backside illumination) structures are known for solid state imaging devices such as complementary metal-oxide-semiconductor (CMOS) image sensors. Front-illuminated solid state imaging devices have a structure in which a wiring layer, color filters, and micro lenses are stacked in this order over a semiconductor layer containing photodiodes. In front-illuminated solid state imaging devices, light from an imaging target object, that has passed through a micro lens and a color filter, passes through a gap in the wiring layer before arriving at a photodiode. Thus, in front-illuminated solid state imaging devices, light incident from a diagonal direction may be reflected by the wiring layers. Accordingly, in the in front-illuminated solid state imaging devices, increasing light utilization efficiency and improving sensitivity may become difficult.

On the other hand, back-illuminated solid state imaging devices have color filters and micro lenses on the opposite side to a face of the semiconductor layer where the wiring layers are formed. Namely, in back-illuminated solid state imaging devices, light from an imaging target object that has passed through a micro lens and a color filter arrives at a photodiode without passing through the wiring layer. Back-illuminated solid state imaging devices enable improved light utilization efficiency and greater sensitivity than front-illuminated devices.

The following technology is known regarding back-illuminated solid state imaging devices. For example, Japanese Patent Application Laid-Open (JP-A) No. 2005-268643 discloses providing a light-illuminated face on the back face side of a silicon substrate with an antireflective film having two layers with a different refractive index than that of the silicon substrate. Further, the Japanese Patent Application Laid-Open (JP-A) No. 2005-268643 discloses that the two-layer antireflective film may be formed from two layers of film selected from the group consisting of silicon oxide film, silicon nitride film, silicon oxynitride film, and polycrystalline silicon film.

As described above, in back-illuminated solid state imaging devices, an antireflective film with a lower refractive index than the refractive index of a semiconductor layer is provided at the light-incidence face of the semiconductor layer, in order to prevent reflection of light at the light-incidence face of the semiconductor layer. In cases in which the semiconductor layer is configured from silicon (Si), a silicon nitride (SiN) film, for example, may be employed as the antireflective film. However, such an antireflective film may cause a comparatively large amount of stress to arise near an interface with the semiconductor layer, resulting in crystal defects arising within the semiconductor substrate and in noise arising in signals output from the photodiodes due to the stress. Therefore, in order to prevent the occurrence of crystal defects caused by such stress, a buffer layer configured by a silicon oxide ($SiO_2$) film, for example, may be provided between the semiconductor layer and the antireflective film, so as to relax the stress. However, as the refractive index of silicon oxide ($SiO_2$) film is lower than the refractive index of the silicon nitride (SiN) film configuring the antireflective film, the antireflective effect of the antireflective film may be reduced.

SUMMARY

The present disclosure provides a semiconductor device configuring a back-illuminated solid state imaging device that may suppress occurrence of crystal defects within a semiconductor layer without diminishing the antireflective effect of an antireflective film.

A first aspect of the present disclosure is a semiconductor device including: a light receiving portion provided in a semiconductor layer of a first conductor type, the light receiving portion being of a second conductor type that is different from the first conductor type; a buffer layer provided at a light incidence side of the light receiving portion, the buffer layer being of the first conductor type; and a low refractive index layer provided at a light incidence side of the buffer layer, the low refractive index layer having a lower refractive index than refractive indices of the semiconductor layer and the buffer layer.

A second aspect of the present disclosure is a semiconductor device manufacturing method including: forming, in a semiconductor layer of a first conductor type, a light receiving portion of a second conductor type that is different from the first conductor type; forming, at a light incidence side of the light receiving portion, a buffer layer of the first conductor type; and forming, at a light incidence side of the buffer layer, a low refractive index layer that has a lower refractive index than refractive indices of the semiconductor layer and the buffer layer.

According to the above aspects, the present disclosure may provide a semiconductor device configuring a back-illuminated solid state imaging device that may suppress the occurrence of crystal defects within a semiconductor layer without diminishing the antireflective effect of an antireflective film.

BRIEF DESCRIPTION OF THE DRAWINGS

Exemplary embodiments will be described in detail based on the following figures, wherein.

DETAILED DESCRIPTION

Figure 1:
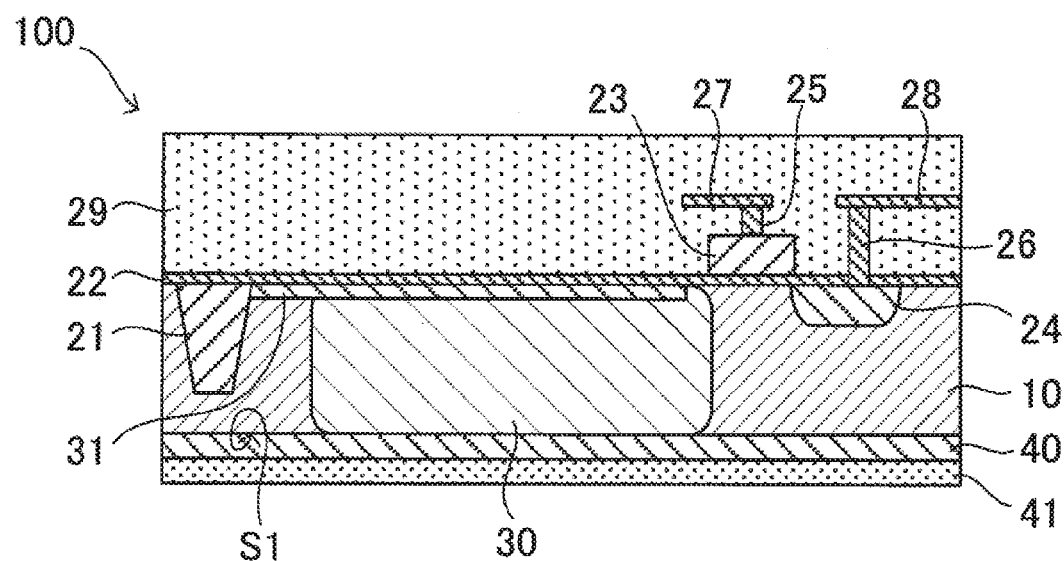
FIG. 1 is a cross-sectional view illustrating configuration of a semiconductor device according to an exemplary embodiment of the present disclosure.

Explanation follows regarding exemplary embodiments of technology disclosed herein, with reference to the drawings. Note that, in each of the drawings, configuration elements and portions that are the same or that are equivalent are applied with the same reference numerals, and duplicate explanation is omitted as appropriate.

First Exemplary Embodiment

FIG. 1 is a cross-sectional view illustrating configuration of a semiconductor device 100 configuring a back-illuminated solid state imaging device according to a first exemplary embodiment of the present disclosure.

The semiconductor device 100 includes, for example, a p-type light receiving portion 30 configuring a photodiode in a semiconductor layer 10 configured from n-type monocrystalline silicon. In the present exemplary embodiment, the light receiving portion 30 is formed to a depth reaching a surface S1 of the light incidence side of the semiconductor layer 10. Note that the semiconductor layer 10 is provided with plural photodiodes configured similarly to the configuration illustrated in FIG. 1. Each of the photodiodes configures a respective one of plural pixels in the solid state imaging device.

The light receiving portion 30 generates electric charges according to the amount of light incident thereon from the surface S1 side of the semiconductor layer 10. A n-type pinning layer 31, provided running along the surface of the light receiving portion 30, is provided at the opposite side of the semiconductor layer 10, opposite to the light incidence side surface S1. The pinning layer 31 serves to suppress the occurrence of noise caused by an interface state at the surface of the light receiving portion 30.

Further, a p-type floating diffusion 24 is provided in the semiconductor layer 10 spaced apart from the light receiving portion 30. An element isolation region 21 configured from an insulator such as $SiO_2$ is also provided in the semiconductor layer 10. The plural photodiodes provided in the semiconductor layer 10 are electrically isolated by the element isolation region 21.

A gate electrode 23 is provided across a gate insulating film 22, in a region corresponding to the region between the floating diffusion 24 and the light receiving portion 30 at a surface on the opposite side of the semiconductor layer 10 to the light incidence side surface S1. The gate electrode 23 is connected to wiring line 27 through a contact plug 25 configured from a conductor. The floating diffusion 24 is connected to wiring line 28 through a contact plug 26 configured from a conductor. An insulating film 29, configured from an insulator such as $SiO_2$, covers a surface on the opposite side of the semiconductor layer 10 to the light incidence side surface S1. The gate electrode 23, the contact plugs 25, 26, and the wiring lines 27, 28 are embedded in the insulating film 29.

The light incidence side surface S1 of the semiconductor layer 10 is covered by a buffer layer 40. In the present exemplary embodiment, the buffer layer 40 is configured from n-type amorphous silicon, this being an opposite conductor type to the conductor type of the light receiving portion 30. The buffer layer 40 contacts the light receiving portion 30.

A surface on the light incidence side of the buffer layer 40 is covered by a low refractive index layer 41 that has a lower refractive index than the refractive indexes of the semiconductor layer 10 and the buffer layer 40. The refractive index of both the monocrystalline silicon configuring the semiconductor layer 10 and the amorphous silicon configuring the buffer layer 40 is approximately 4. A silicon nitride (SiN) film with a refractive index of approximately 2, for example, may be employed as the low refractive index layer 41. By configuring the low refractive index layer 41 from a material having a lower refractive index than the refractive indexes of the semiconductor layer 10 and the buffer layer 40, the low refractive index layer 41 functions as an antireflective film that prevents the reflection of light radiated onto the surface S1.

Explanation follows regarding an example method of manufacturing the semiconductor device 100, with reference to FIG. 2A to FIG. 2L.

Figure 2A:
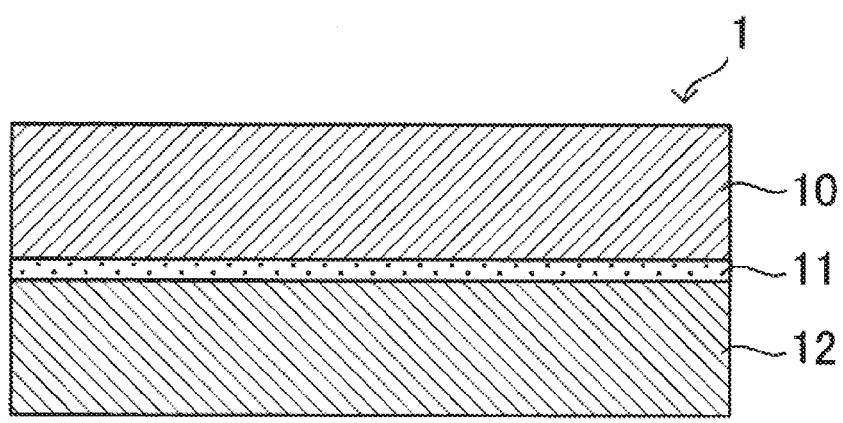
FIG. 2A is a diagram illustrating a method of manufacturing a semiconductor device according the exemplary embodiment of the present disclosure.

Firstly, a silicon on insulator (SOI) substrate 1 upon which a substrate layer 12, a buried oxide layer 11, and a semiconductor layer 10 have been stacked is prepared (FIG. 2A).

Figure 2B:
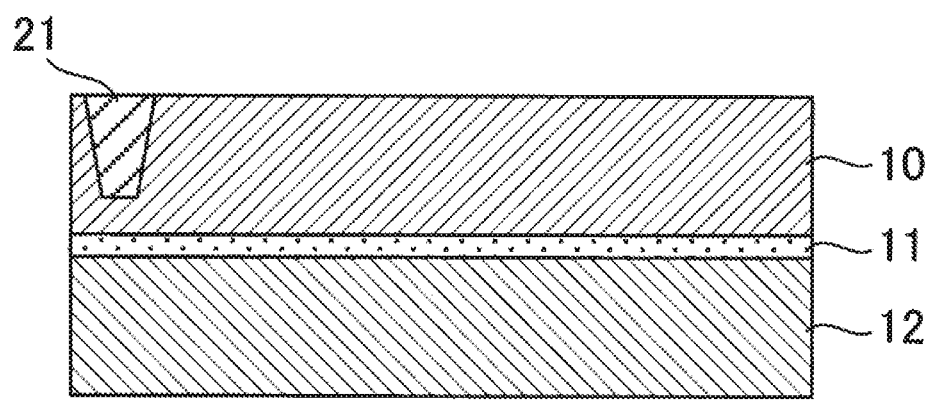
FIG. 2B is a diagram illustrating a method of manufacturing a semiconductor device according the exemplary embodiment of the present disclosure.

Next, using a known shallow trench isolation (STI) process, for example, an element isolation region 21 configured from an insulator such as $SiO_2$ is formed in the semiconductor layer 10 (FIG. 2B).

Figure 2C:
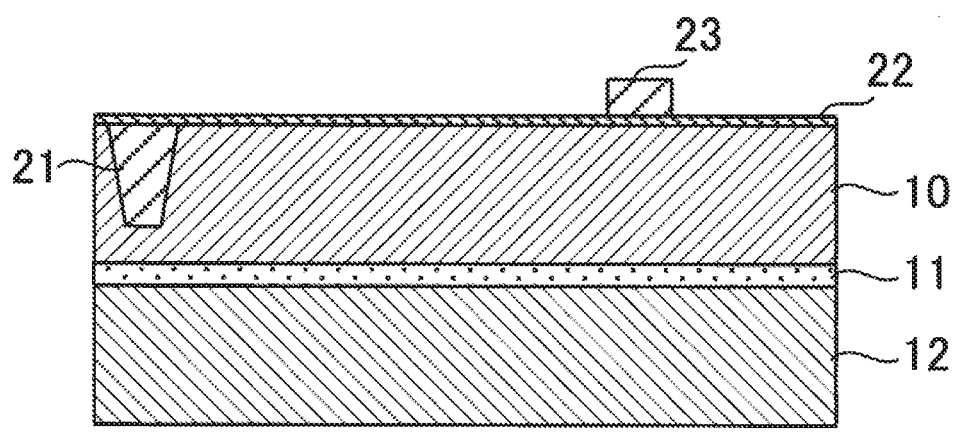
FIG. 2C is a diagram illustrating a method of manufacturing a semiconductor device according the exemplary embodiment of the present disclosure.

Next, using a known thermal oxidation process, for example, a gate insulating film 22 configured from an insulator such as $SiO_2$ is formed on the surface of the semiconductor layer 10. Then, using a known chemical vapor deposition (CVD) process, for example, a polysilicon film is deposited on the surface of the gate insulating film 22, and the polysilicon film is patterned using a known photolithographic technique to form a gate electrode 23 (FIG. 2C). Note that, after forming the polysilicon film, ion implantation processing for lowering the resistance of the gate electrode 23 may be performed.

Figure 2D:
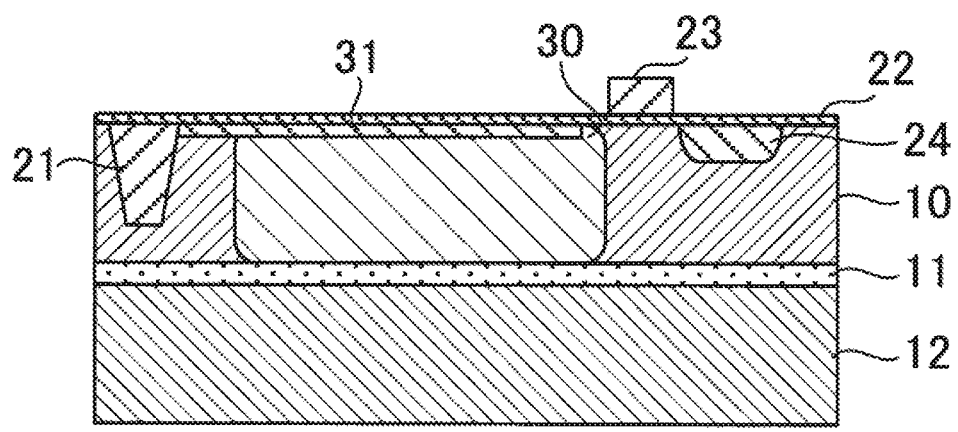
FIG. 2D is a diagram illustrating a method of manufacturing a semiconductor device according the exemplary embodiment of the present disclosure.

Next, using a known ion implantation process, impurity ions composed of a group 3 element such as, for example, boron, are implanted in the vicinity of the gate electrode 23 of the semiconductor layer 10. Afterwards, the impurity ions are activated through thermal processing. A p-type light receiving portion 30 configuring a photodiode is thereby formed in the semiconductor layer 10. The light receiving portion 30 is formed so as to reach to an interface between the semiconductor layer 10 and the buried oxide layer 11. Then, for example, impurity ions composed of a group 5 element such as phosphorus (P) or arsenic (As) are implanted in the semiconductor layer 10 to form a n-type pinning layer 31 on the surface of the light receiving portion 30. Then, impurity ions composed of a group 3 element such as boron are implanted in the semiconductor layer 10 at a position opposing the light receiving portion 30 on the other side of the gate electrode 23 from the light receiving portion 30. Afterwards, the impurity ions are activated through thermal processing. Accordingly, a p-type floating diffusion 24 is formed in the semiconductor layer 10 at a position opposing the light receiving portion 30 on the other side of the gate electrode 23 from the light receiving portion 30 (FIG. 2D).

Figure 2E:
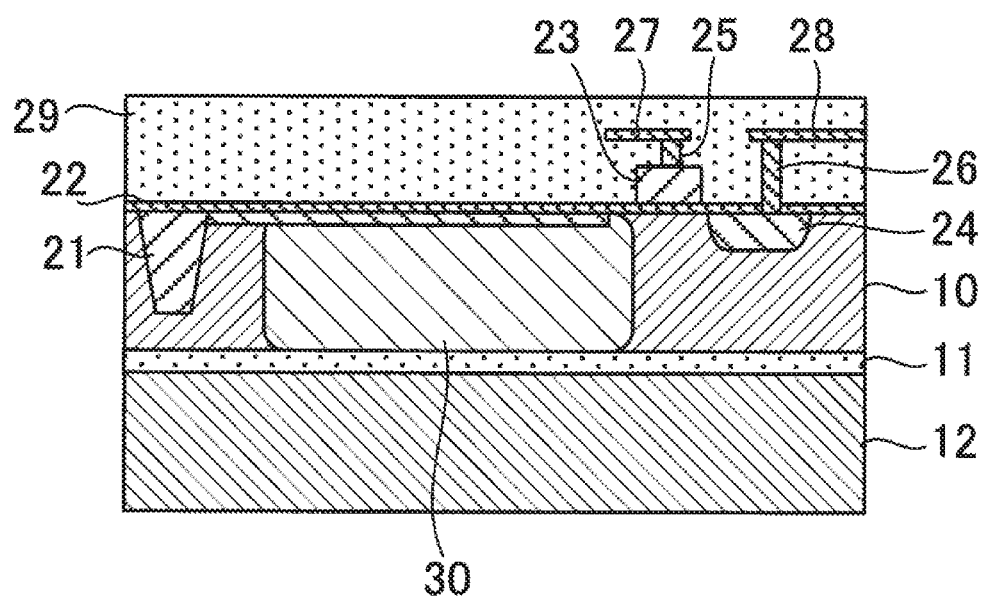
FIG. 2E is a diagram illustrating a method of manufacturing a semiconductor device according the exemplary embodiment of the present disclosure.

Next, using a known CVD process, for example, an insulating film 29 configured from an insulator such as $SiO_2$ is formed on the surface of the semiconductor layer 10. Then, a contact hole reaching to the gate electrode 23 and a contact hole reaching to the floating diffusion 24 are formed in the insulating film 29, and a conductor such as tungsten (W) is filled into these contact holes to form the contact plugs 25 and 26. Then, a conducting film, configured from a conductor such as aluminum, is formed on the surface of the insulating film 29, and this conducting film is patterned using a known photolithographic technique to form wiring lines 27 and 28 respectively connected to the contact plugs 25 and 26. Afterwards, additional insulating film 29 is formed so as to cover the wiring lines 27 and 28 (FIG. 2E).

Figure 2F:
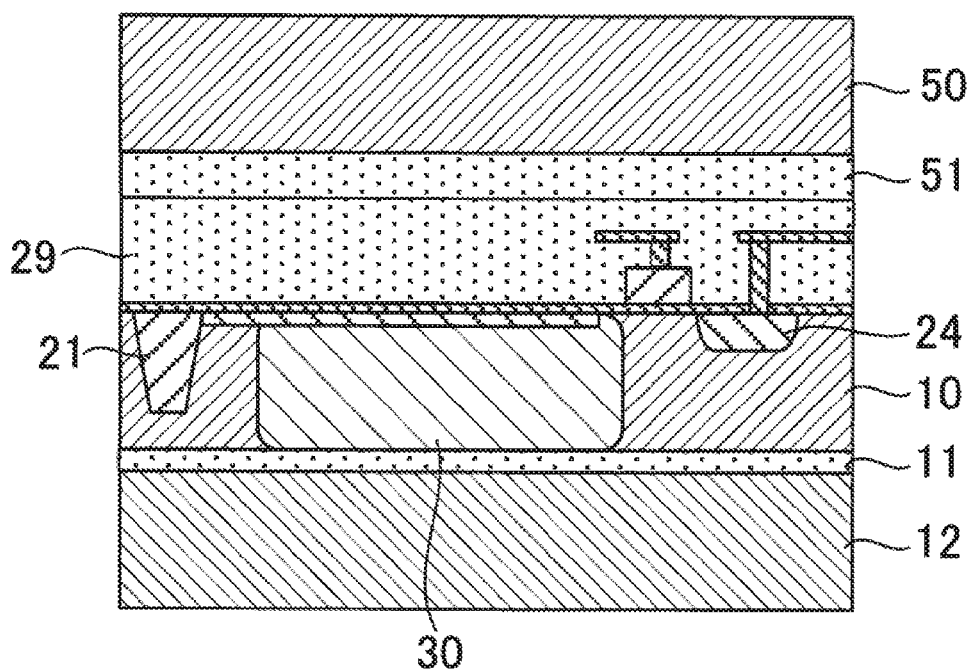
FIG. 2F is a diagram illustrating a method of manufacturing a semiconductor device according the exemplary embodiment of the present disclosure.

Next, a supporting substrate 50 with a surface having an insulating film 51 of $SiO_2$ or the like formed thereon is attached to the SOI substrate. Before attaching the substrates, it is preferable to conduct interface activation processing, using plasma irradiation, on the respective joining faces of both substrates, these being the surface of the insulating film 51 on the supporting substrate 50 side and the surface of the insulating film 29 on the SOI substrate side (FIG. 2F).

Figure 2G:
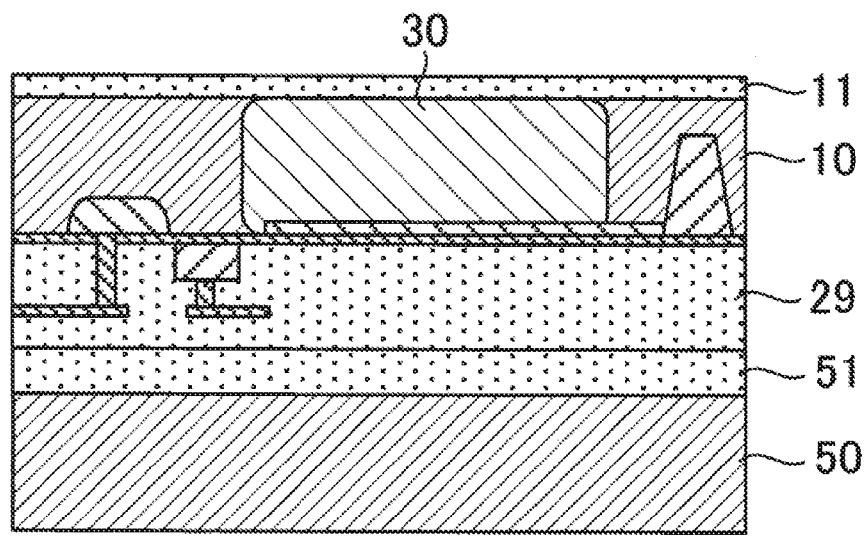
FIG. 2G is a diagram illustrating a method of manufacturing a semiconductor device according the exemplary embodiment of the present disclosure.

Next, using a known backgrinding technique, a substrate layer 12 of the SOI substrate is ground to expose the buried oxide layer 11 (FIG. 2G).

Figure 2H:
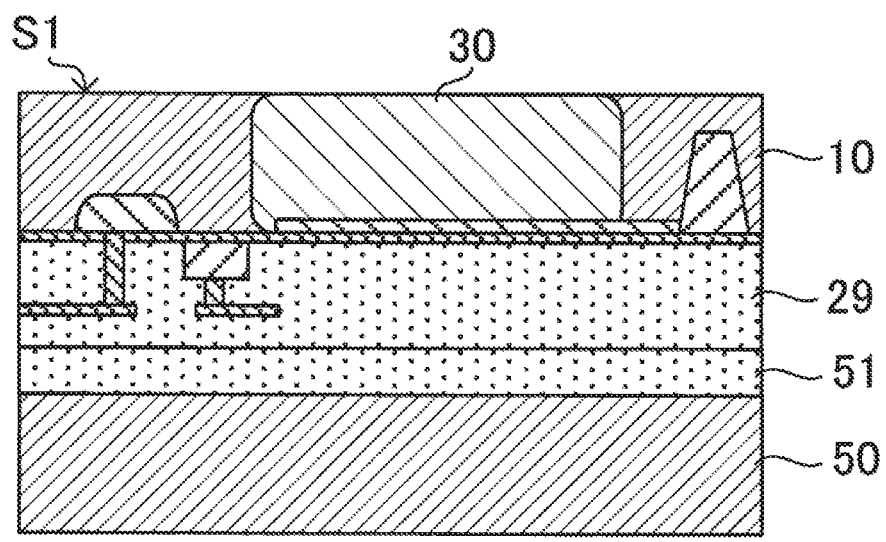
FIG. 2H is a diagram illustrating a method of manufacturing a semiconductor device according the exemplary embodiment of the present disclosure.

Next, the buried oxide layer 11 is removed by known wet etching processing and the surface S1 on the light incidence side of the semiconductor layer 10 is exposed. A surface on the light incidence side of the light receiving portion 30 is also thereby exposed (FIG. 2H).

Figure 2I:
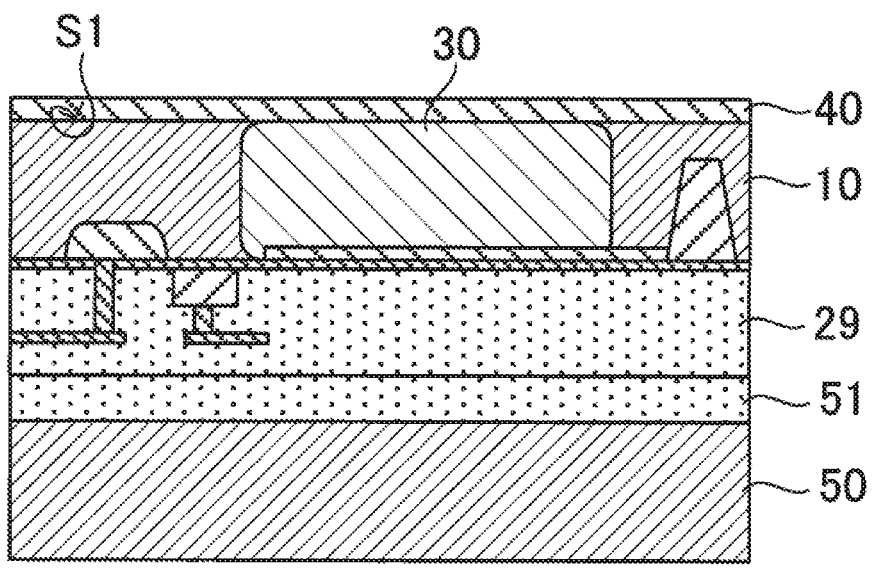
FIG. 2I is a diagram illustrating a method of manufacturing a semiconductor device according the exemplary embodiment of the present disclosure.

Next, using a known plasma CVD process or catalytic CVD (Cat-CVD) process, a buffer layer 40 approximately 10 nm to 50 nm thick configured from amorphous silicon is formed over the surface S1 on the light incidence side of the semiconductor layer 10. In this CVD process, for example, silane gas ($SiH_4$) and hydrogen gas ($H_2$) may be employed as the source gas (FIG. 2I).

Figure 2J:
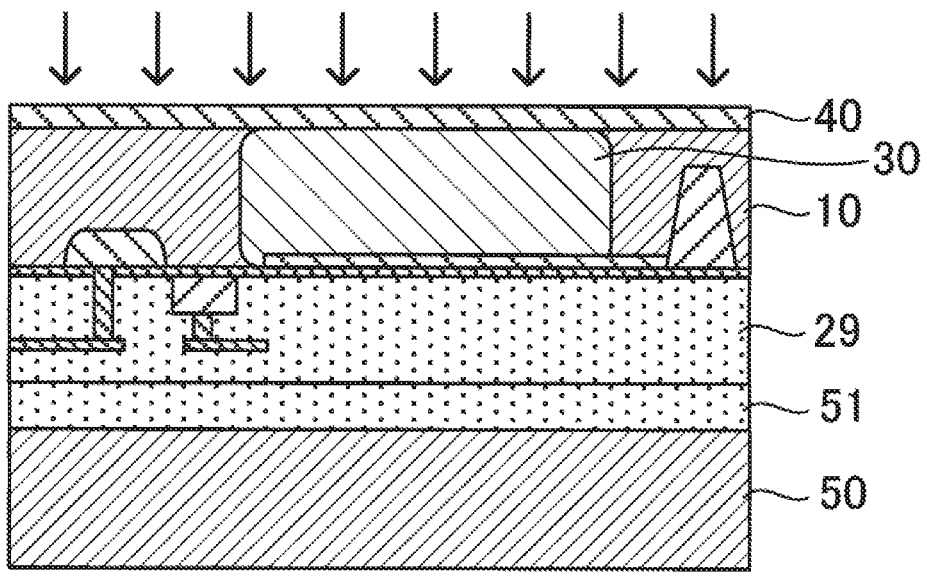
FIG. 2J is a diagram illustrating a method of manufacturing a semiconductor device according the exemplary embodiment of the present disclosure.

Next, using a known ion implantation process, impurity ions composed of a group 5 element such as phosphorus (P) or arsenic (As) are implanted in the buffer layer 40. Then, the impurity ions implanted in the buffer layer 40 are activated by irradiating a Nd:YLF laser on the surface of the buffer layer 40. The buffer layer 40 is thereby imparted with n-type conductivity (FIG. 2J). Such laser annealing processing makes thermal processing of the entire device unnecessary, and so the laser annealing processing may also be employed after formation of the wiring lines 27 and 28. Moreover, the ion implantation processing and laser annealing processing of the present manufacturing process are processes on the buffer layer 40, and damage to the semiconductor layer 10 from such processing can be substantially eliminated by suitably setting the acceleration voltage and the laser power during ion implantation.

Figure 2K:
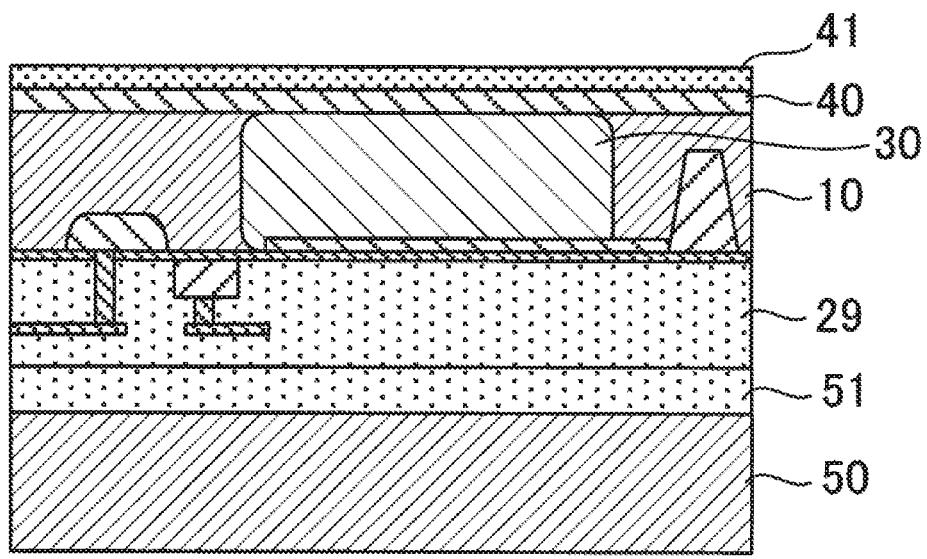
FIG. 2K is a diagram illustrating a method of manufacturing a semiconductor device according the exemplary embodiment of the present disclosure.

Next, using a known plasma CVD process, a low refractive index layer 41 configured from a silicon nitride (SiN) film, for example, is formed on the surface of the buffer layer 40. In this CVD process, for example, silane gas ($SiH_4$), ammonia gas ($NH_3$), and nitrogen gas ($N_2$) may be employed as the source gas (FIG. 2K). The thickness of the low refractive index layer 41 is set in accordance with the wavelength region of light to be sensed by the semiconductor device 100 serving as a solid state imaging device. For example, in a case in which the wavelength region of light sensed by the semiconductor device 100 is in the infrared wavelength region, the thickness of the low refractive index layer 41 may be set to approximately 120 nm.

As described above, the semiconductor device 100 according to this exemplary embodiment of the present disclosure includes a p-type light receiving portion 30 that configures a photodiode provided in the n-type semiconductor layer 10; a buffer layer 40 that is provided on the light incidence side of the light receiving portion 30, and that is configured from n-type amorphous silicon; and a low refractive index layer 41 that is provided to the light incidence side of the buffer layer 40, and that has a lower refractive index than the refractive indexes of the semiconductor layer 10 and the buffer layer 40.

Since the refractive index of the low refractive index layer 41 is lower than the refractive index of the semiconductor layer 10, the low refractive index layer 41 functions as an antireflective film. Since the buffer layer 40 is interposed between the semiconductor layer 10 and the low refractive index layer 41, the buffer layer 40 relaxes stress acting on the semiconductor layer 10 caused by the low refractive index layer 41. Accordingly, the occurrence of crystal defects within the semiconductor layer 10 may be suppressed. The buffer layer 40 is configured from amorphous silicon, the refractive index of which is about the same as the refractive index of the semiconductor layer configured from monocrystalline silicon, and is higher than the refractive index of the low refractive index layer 41. Accordingly, the buffer layer 40 may exhibit stress relaxation functionality without reducing the antireflective effect of the low refractive index layer 41.

Additionally, the buffer layer 40 contacts the light receiving portion 30, and has the opposite conductor type to the conductor type of the light receiving portion 30. Accordingly, the buffer layer 40 functions as a pinning layer that suppresses the occurrence of noise caused by an interface state at the surface of the light receiving portion 30. Namely, the light receiving portion 30 is sandwiched by the pinning layer 31 provided at a side opposite to the light incidence side surface S1 and by the buffer layer 40 that also functions as a pinning layer provided at the light incidence side surface S1 side. Accordingly, a low-noise solid state imaging device may be configured.

Figure 2L:
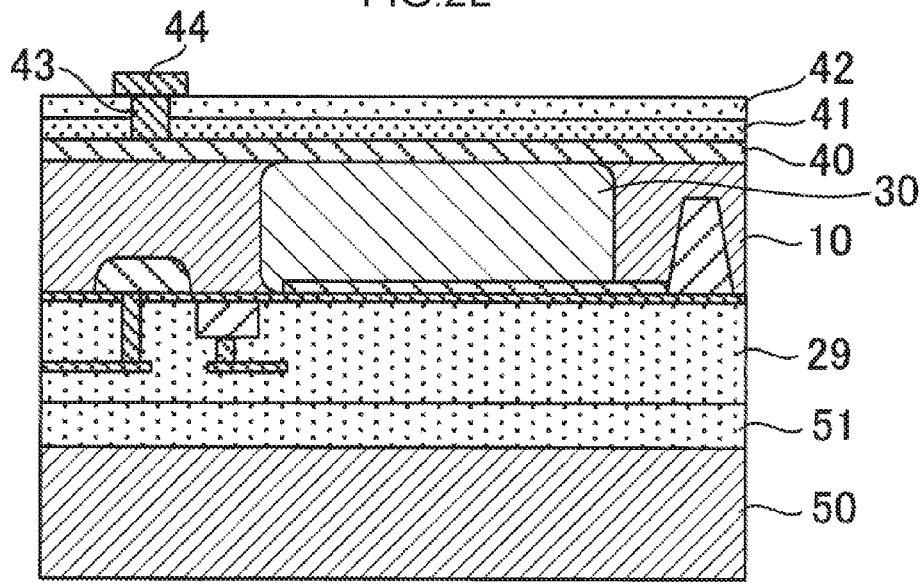
FIG. 2L is a diagram illustrating a method of manufacturing a semiconductor device according the exemplary embodiment of the present disclosure.

Note that configuration may be made in which an electrode electrically connected to the buffer layer 40 is provided such that a voltage can be applied to the buffer layer 40. By applying a voltage to the buffer layer 40, the pinning layer functionality of the buffer layer 40 may be promoted. In a case in which an electrode that is electrically connected to the buffer layer 40 is provided, for example, as illustrated in FIG. 2L, an insulating layer 42 configured from an insulator (for example, $SiO_2$) with an even smaller refractive index than that of the low refractive index layer 41 is formed on the surface of the low refractive index layer 41. Then, the insulating layer 42 and the low refractive index layer 41 are penetrated, and a contact hole reaching to the buffer layer 40 is formed. Then, a conductor such as tungsten (W) is filled into the contact hole to form a contact plug 43. Afterwards, an electrode 44 configured from a conductor such as aluminum that connects to the contact plug 43 is formed on the surface of the insulating layer 42.

In the present exemplary embodiment, a method in which impurity ions were implanted in the buffer layer 40 after formation of the buffer layer 40 was employed as the method to impart the buffer layer 40 with conductivity. However, the present exemplary embodiment is not limited to this method. For example, in a case in which the buffer layer 40 is formed using a plasma CVD process or a catalytic CVD (Cat-CVD) process, a mixed gas, in which a source gas that includes silane gas ($SiH_4$) and hydrogen gas ($H_2$) is mixed with an impurity gas that includes a group 5 element such as phosphorus (P) or arsenic (As), may be employed. According to the above, conductivity may be imparted to the buffer layer 40 at the formation stage of the buffer layer 40.

In the present exemplary embodiment, although amorphous silicon was employed as the material of the buffer layer 40, it is also possible to use polysilicon instead of amorphous silicon. Thus, even in a case in which the buffer layer 40 is configured from polysilicon, a similar effect to a case in which the buffer layer 40 is configured from amorphous silicon may be obtained. Similarly to a case using amorphous silicon, a known CVD process may be used to form a buffer layer 40 configured from polysilicon. Moreover, similarly to a case using amorphous silicon, a known ion implantation process may be used to impart conductivity to a buffer layer 40 configured from polysilicon. Alternatively, the buffer layer 40 may be imparted with conductivity by the introduction of an impurity gas when forming the buffer layer 40 using a CVD process.

Second Exemplary Embodiment

Figure 3:
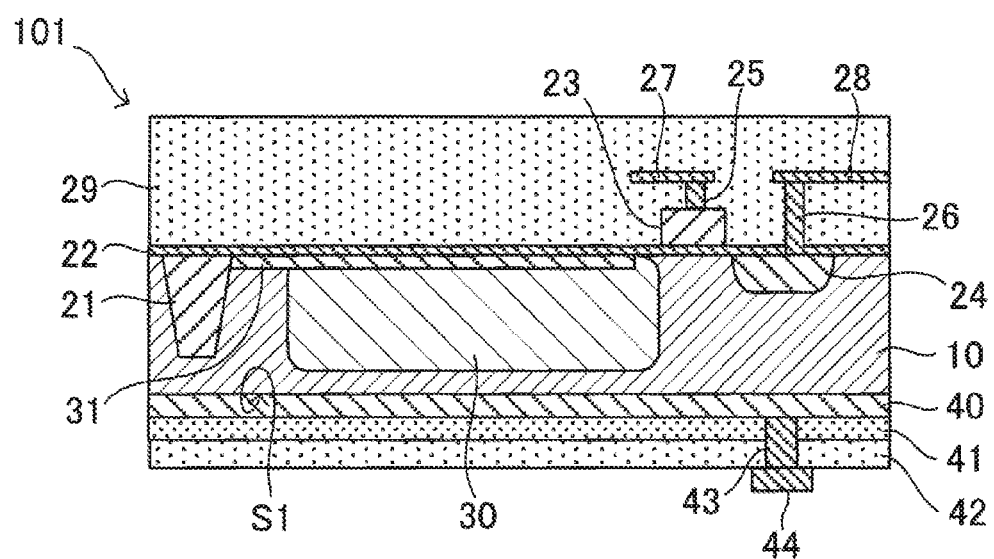
FIG. 3 is a cross-sectional view illustrating configuration of a semiconductor device according to another exemplary embodiment of the present disclosure.

FIG. 3 is a cross-sectional view illustrating configuration of a semiconductor device 101 configuring a back-illuminated solid state imaging device according to a second exemplary embodiment of the present disclosure. Similarly to the semiconductor device 100 according to the first exemplary embodiment, the semiconductor device 101 includes a p-type light receiving portion 30 that configures a photodiode provided in a n-type semiconductor layer 10; a buffer layer 40 that is provided on the light incidence side of the light receiving portion 30, and that is configured from n-type amorphous silicon; and a low refractive index layer 41 that is provided to the light incidence side of the buffer layer 40, and that has a lower refractive index than the refractive indexes of the semiconductor layer 10 and the buffer layer 40.

The semiconductor device 101 according to the present exemplary embodiment differs from the semiconductor device 100 according to the first exemplary embodiment in the following respects. Namely, in the semiconductor device 101 according to the present exemplary embodiment, the buffer layer 40 contacts the semiconductor layer 10, but does not contact the light receiving portion 30. In other words, the light receiving portion 30 does not reach to the surface S1 on the light incidence side of the semiconductor layer 10. The semiconductor device 101 also includes an electrode 44 electrically connected to the buffer layer 40 through a contact plug 43 configured from a conductor. More specifically, an insulating layer 42 configured from $SiO_2$ having an even smaller refractive index than that of the low refractive index layer 41 is provided to the light incidence side of the low refractive index layer 41. The contact plug 43 penetrates the insulating layer 42 and the low refractive index layer 41 and reaches to the buffer layer 40, and the electrode 44 is provided to the surface of the insulating layer 42 and is connected to the contact plug 43.

Figure 4A:
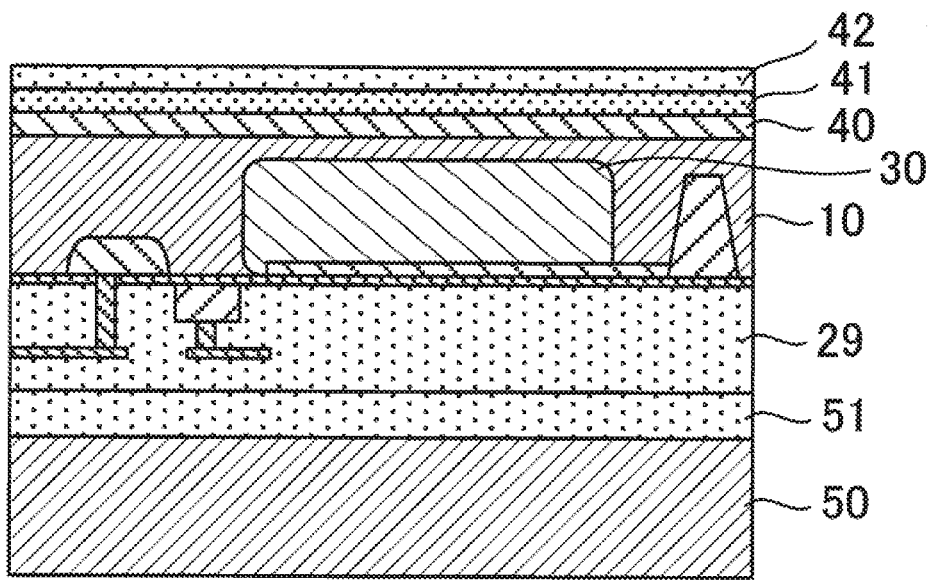
FIG. 4A a diagram illustrating a method of manufacturing a semiconductor device according the other exemplary embodiment of the present disclosure.
Figure 4B:
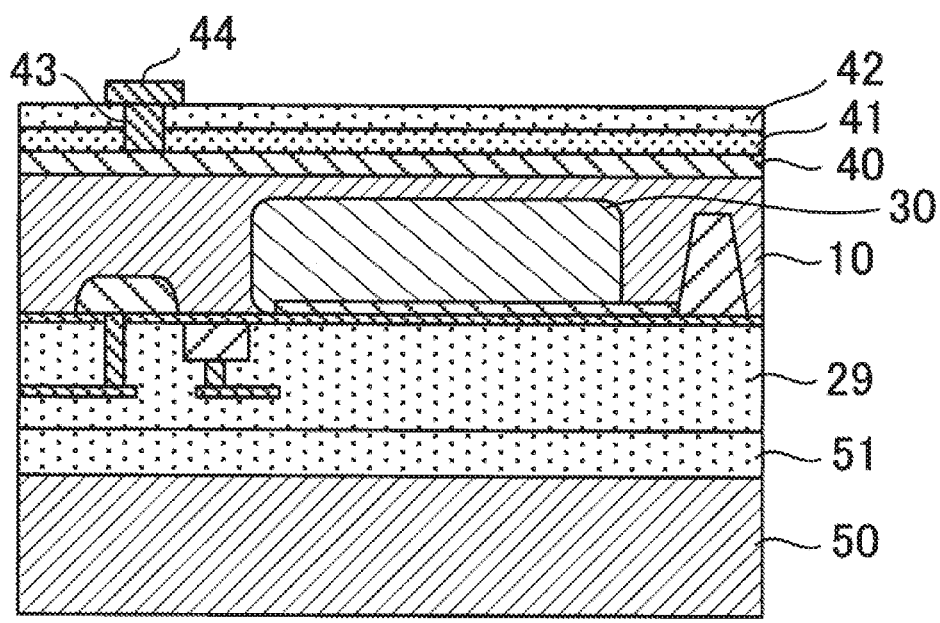
FIG. 4B a diagram illustrating a method of manufacturing a semiconductor device according the other exemplary embodiment of the present disclosure.

Explanation follows regarding an example method of manufacturing the semiconductor device 101 according to the second Exemplary Embodiment, with reference to FIG. 4A and FIG. 4B. The method of manufacturing the semiconductor device 101 is basically the same as the method of manufacturing the semiconductor device 100 according to the first exemplary embodiment up until the process of forming the low refractive index layer 41 (FIG. 2K). However, it differs from the method of manufacturing the semiconductor device 100 according to the first exemplary embodiment, in that the light receiving portion 30 is formed such that the terminal depth direction position of the light receiving portion 30 does not reach to the surface S1 on the light incidence side of the semiconductor layer 10. The depth of the light receiving portion 30 can be adjusted by controlling the ion acceleration voltage during ion implantation for forming the light receiving portion 30.

After forming the low refractive index layer 41 on the surface of the buffer layer 40, an insulating layer 42 configured from an insulator such as $SiO_2$ is formed on the surface of the low refractive index layer 41 using, for example, a known CVD process (FIG. 4A).

Next, after the insulating layer 42 and the low refractive index layer 41 are penetrated and a contact hole reaching to the buffer layer 40 is formed, a conductor such as tungsten (W) is filled into this contact hole to form a contact plug 43. Afterwards, an electrode 44 configured from a conductor such as aluminum that connects to the contact plug 43 is formed on the surface of the insulating layer 42.

As described above, in the semiconductor device 101 according to the present exemplary embodiment, as the refractive index of the low refractive index layer 41 is lower than the refractive index of the semiconductor layer 10, the low refractive index layer 41 functions as an antireflective film. Since the buffer layer 40 is interposed between the semiconductor layer 10 and the low refractive index layer 41, the buffer layer 40 relaxes stress acting on the semiconductor layer 10 caused by the low refractive index layer 41. Accordingly, the occurrence of crystal defects within the semiconductor layer 10 may be suppressed. The buffer layer 40 is configured from amorphous silicon, the refractive index of which is about the same as the refractive index of the semiconductor layer configured from monocrystalline silicon, and is higher than the refractive index of the low refractive index layer 41. Accordingly, the buffer layer 40 may exhibit stress relaxation functionality without reducing the antireflective effect of the low refractive index layer 41.

Note that there are cases in which imaging is performed with the photodiodes in a reverse biased state by applying a voltage to the semiconductor layer 10. In the semiconductor device 101 according to the present exemplary embodiment, the buffer layer 40 contacts the semiconductor layer 10, and the buffer layer 40 is the same conductor type as the semiconductor layer 10. The buffer layer 40 is also connected to the electrode 44 through the contact plug 43. Accordingly, it is possible to for a voltage to be applied to the semiconductor layer 10 through the electrode 44, the contact plug 43, and the buffer layer 40. Namely, in the semiconductor device 101 according to the present exemplary embodiment, the buffer layer 40 also functions as a contact layer for applying voltage to the semiconductor layer 10. Note that it is also possible to use polysilicon instead of amorphous silicon for the material of the buffer layer 40.

In the first and second exemplary embodiments described above, although examples were given in which the semiconductor layer 10 and the buffer layer 40 were configured from n-type conductors, and the light receiving portion 30 and the floating diffusion 24 were configured from p-type conductors, the respective conductor types of these configuration elements may be reversed.

What is claimed is:

1. A semiconductor device comprising:
   a light receiving portion formed within a semiconductor layer of a first conductivity type, the light receiving portion being a second conductivity type that is different from the first conductivity type;
   a buffer layer provided at a light incidence side of the light receiving portion, the buffer layer being the first conductivity type;
   a low refractive index layer provided at a light incidence side of the buffer layer, the low refractive index layer having a refractive index lower than refractive indices of the semiconductor layer and the buffer layer;
   an insulating layer at a light incidence side of the low refractive index layer, the insulating layer comprising an insulator having a refractive index smaller than the refractive index of the low refractive index layer;
   an electrode disposed over the insulating layer and that is electrically connected to the buffer layer; and
   a contact plug comprising a conductor and that electrically connects the electrode to the buffer layer through the insulating layer and the low refractive index layer.

2. The semiconductor device of claim 1, wherein the buffer layer contacts the light receiving portion.

3. The semiconductor device of claim 1, wherein the buffer layer contacts the semiconductor layer without contacting the light receiving portion.

4. The semiconductor device of claim 1, wherein the buffer layer comprises amorphous silicon or polysilicon.

5. A semiconductor device manufacturing method comprising:
   forming, within a semiconductor layer of a first conductivity type, a light receiving portion of a second conductivity type that is different from the first conductivity type;
   forming, at a light incidence side of the light receiving portion, a buffer layer of the first conductivity type;
   forming, at a light incidence side of the buffer layer, a low refractive index layer that has a refractive index lower than refractive indices of the semiconductor layer and the buffer layer;
   forming, at a light incidence side of the low refractive index layer, an insulating layer, the insulating layer comprising an insulator having a refractive index smaller than the refractive index of the low refractive index layer;
   forming, through the insulating layer and the low refractive index layer, a contact plug comprising a conductor and that electrically connects to the buffer layer; and
   forming, over the insulating layer, an electrode that is electrically connected to the buffer layer by the contact plug.

6. The semiconductor device manufacturing method of claim 5, wherein the forming the buffer layer comprises using a vapor deposition process employing a mixed gas in which a source gas that is a source for amorphous silicon is mixed with an impurity gas that includes impurities that impart conductivity to the amorphous silicon.

7. The semiconductor device manufacturing method of claim 5, wherein the forming the buffer layer comprises:
   forming a non-doped amorphous silicon layer on the light incidence side of the light receiving portion; and
   implanting impurities in the non-doped amorphous silicon layer to impart the amorphous silicon layer with conductivity.

8. The semiconductor device manufacturing method of claim 6, further comprising irradiating a laser on the buffer layer to activate impurities included in the buffer layer.

9. The semiconductor device manufacturing method of claim 5, wherein the buffer layer comprises amorphous silicon or polysilicon.

* * * * *